United States Patent
Lu et al.

(10) Patent No.: US 8,975,189 B2
(45) Date of Patent: Mar. 10, 2015

(54) METHOD OF FORMING FINE PATTERNS

(75) Inventors: Chih Wei Lu, Hsin-Chu (TW); Chung-Ju Lee, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 142 days.

(21) Appl. No.: 13/616,101

(22) Filed: Sep. 14, 2012

(65) Prior Publication Data

US 2014/0080306 A1 Mar. 20, 2014

(51) Int. Cl.
  *H01L 21/311* (2006.01)
  *H01L 21/3105* (2006.01)
(52) U.S. Cl.
  CPC .... H01L 21/31058 (2013.01); H01L 21/31144 (2013.01)
  USPC .... 438/703; 438/584; 438/702; 257/E21.257; 257/E21.577
(58) Field of Classification Search
  USPC ............... 438/624, 633, 638, 703, 717, 737; 257/1, 9, 48, 499, E21.206, E21.314; 430/296, 311, 312, 313, 322, 328, 942
  See application file for complete search history.

(56) References Cited

U.S. PATENT DOCUMENTS

| | | | |
|---|---|---|---|
| 2002/0160320 A1* | 10/2002 | Shields et al. | 430/328 |
| 2006/0274049 A1* | 12/2006 | Spath et al. | 345/173 |
| 2012/0318773 A1* | 12/2012 | Wu et al. | 216/68 |

* cited by examiner

*Primary Examiner* — Charles Garber
*Assistant Examiner* — Abdulfattah Mustapha
(74) *Attorney, Agent, or Firm* — Slater & Matsil, L.L.P.

(57) ABSTRACT

A method of forming a fine pattern comprises depositing a modifying layer on a substrate. A photoresist layer is deposited on the modifying layer, the photoresist layer having a first pattern. The modifying layer is etched according to the first pattern of the photoresist layer. A treatment is performed to the etched modifying layer to form a second pattern, the second pattern having a smaller line width roughness (LWR) and/or line edge roughness (LER) than the first pattern. The second pattern is then etched into the substrate.

20 Claims, 3 Drawing Sheets

METHOD OF FORMING FINE PATTERNS

BACKGROUND

As the technology of semiconductor fabrication progresses, the critical dimension (CD) has been reduced, making lithography processes more and more challenging. Of particular importance is the control of line width roughness (LWR) or line edge roughness (LER). Line edge or width roughness generally refers to the roughness of a width or edge of a line of material in a semiconductor device (e.g., during fabrication). Uncontrolled LWR and LER can have significant impacts on the resulting semiconductor device (e.g., transistor). These impacts include poor parametric device performance and yield, for example, and variations in critical dimension (CD), which can cause variations in current (Ioff, Idsat).

The conventional photolithography process of forming fine patterns is typically insufficient to address these concerns. There may be limits in improving resolution, e.g., due to limits in the chemical properties of the photoresists, the wavelength or light sources, and/or resolution limits in optical systems. Therefore, a photolithography process addressing the above issues is needed.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
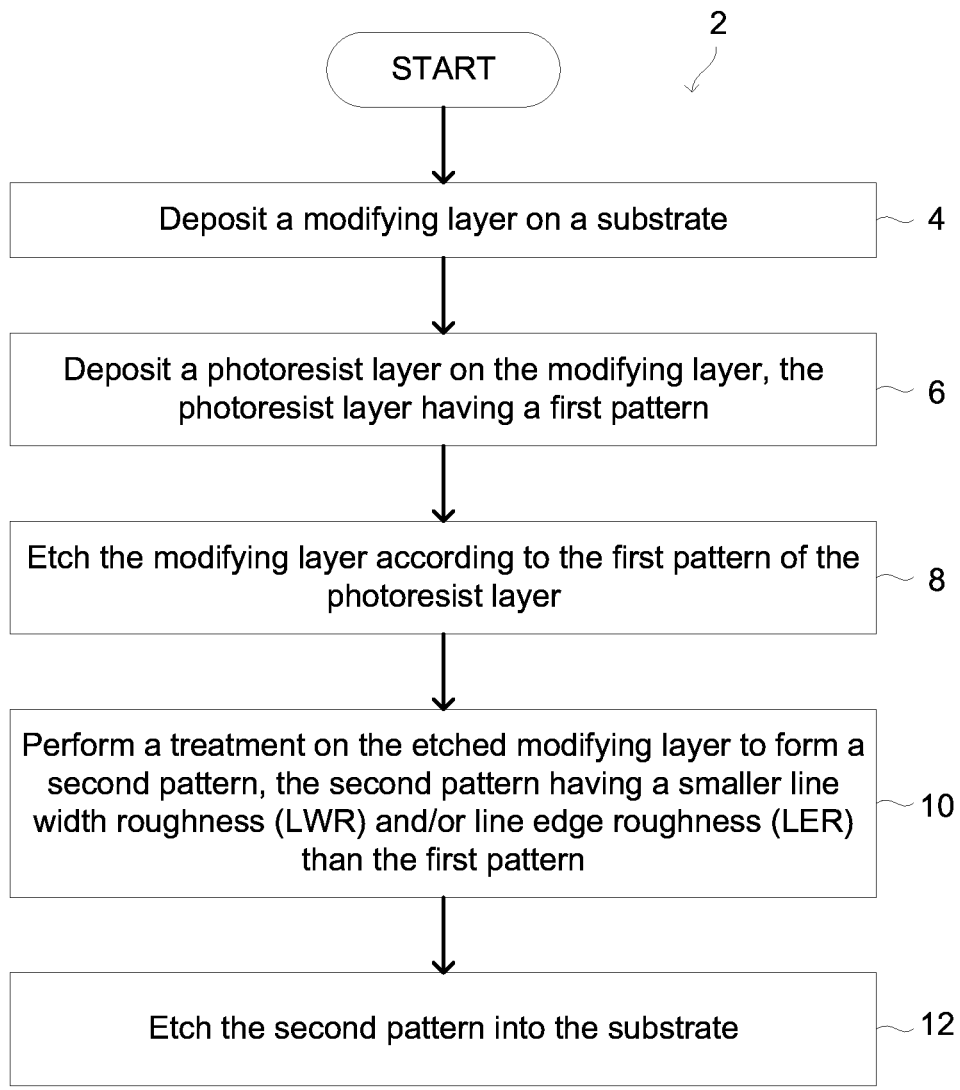
FIG. 1 is a flowchart of a method of forming a fine pattern on a semiconductor device, according to an embodiment of the present disclosure.

FIG. 1 is a flowchart of a method 2 of forming a fine pattern on a semiconductor device according to various aspects of the present disclosure. Referring to FIG. 1, the method includes block 4, in which a modifying layer is deposited on a substrate. The method 2 includes block 6, in which a photoresist layer is deposited on the modifying layer, the photoresist layer having a first pattern. The method 2 includes block 8, in which the modifying layer is etched according to the first pattern of the photoresist layer. The method 2 includes block 10, in which a treatment is performed on the etched modifying layer to form a second pattern. The second pattern has a smaller line width roughness (LWR) and/or line edge roughness (LER) than the first pattern. The method 2 includes block 12, in which the second pattern is then etched into the substrate.

It is understood that additional processes may be performed before, during, or after the blocks 4-12 shown in FIG. 1 to complete the fabrication of the semiconductor device, but these additional processes are not discussed herein in detail for the sake of simplicity.

FIGS. 2-8 are cross-sectional side views of a portion of a semiconductor device at various stages of forming a fine pattern in accordance with various embodiments of the present disclosure. It is understood that FIGS. 2-8 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
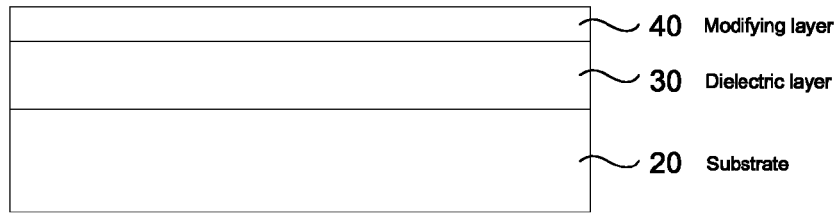
FIGS. 2-8 are cross-sectional side views of a portion of a semiconductor device at various stages of forming a fine pattern in accordance with various embodiments of the present disclosure.

Referring to FIG. 2, a semiconductor substrate 20 is provided. The semiconductor substrate 20 may have one or more layers (e.g., insulating layers, conductive layers, etc.) formed thereon. The semiconductor substrate 20 may include silicon. Alternatively, the substrate 20 includes germanium, silicon germanium or other proper semiconductor materials. In one embodiment, a passivation layer 30 is formed on the semiconductor substrate 20. Passivation layer 30 may be a dielectric layer, and hence is alternatively referred to as dielectric layer 30 hereinafter. Dielectric layer 30 may have a dielectric constant from about 1 to about 40, in one embodiment.

A modifying layer 40 is deposited on dielectric layer 30 using a spin-on coating process, for example. Other methods of depositing the modifying layer 40 on the dielectric layer 30 are also contemplated. In one embodiment, the modifying layer 40 is composed of a polymer. In some embodiments, the modifying layer 40 is composed of a homopolymer. In some other embodiments, the modifying layer 40 is composed of a copolymer. In some embodiments, the modifying layer 40 comprises polycarbonate, polyethylene terephthalate, polysulfone, polyvinyl chloride, polyethylene, polypropylene, polyisobutylene, polystyrene, or polytetraflourethylene. However, the present disclosure may also be practiced with other polymer materials than the examples listed above. The modifying layer 40 has varying thicknesses. In one embodiment, the modifying layer 40 has a thickness in the range from about 1 nm to about 1000 nm, more particularly about 250 nm to about 750 nm in some embodiments.

The modifying layer 40 may comprise an organic or inorganic material. In some embodiments, the organic material may comprise at least a photoreactive compound, a non-photoreactive compound, reactive or non-reactive additives, and/or a solvent. The modifying layer 40 has a glass transition temperature ($T_g$) of less than about 200 Celsius in one embodiment. In some embodiments, the modifying layer 40 has a surface tension of more than about 15 dynes/cm². In other embodiments, the modifying layer 40 has a glass transition temperature ($T_g$) of less than about 200 Celsius and a surface tension of more than about 15 dynes/cm$^2$.

Figure 3:
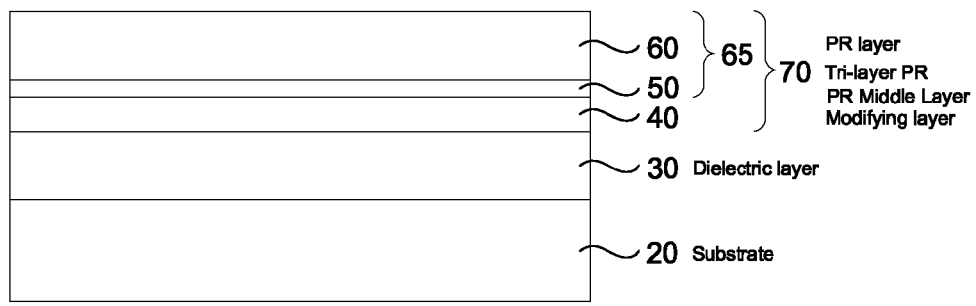

In FIG. 3, a photoresist layer 65 is then formed over the modifying layer 40. In one embodiment, photoresist layer 65 may comprise a photoresist middle layer 50 and a photoresist top layer 60. In the depicted embodiment, the modifying layer 40, the photoresist middle layer 50, and photoresist top layer 60 form the tri-layer photoresist 70. In other embodiments, the modifying layer 40 and the photoresist layer 65 form a bi-layer photoresist coating.

The photoresist layer 70 may be formed using a spin-on coating process. The photoresist may be a negative or positive type photoresist of any suitable composition. The photoresist layer may be soft baked after its deposition. An exposure is then performed on the photosensitive layer. The exposure process patterns the photoresist layer 70 in one embodiment. The exposure process my include introducing a radiation beam to the substrate 20. The radiation beam may be ultraviolet and/or can be extended to include other radiation beams such as ion beam, x-ray, extreme ultraviolet, deep ultraviolet, and other radiation energy. The exposure process may be part of an immersion lithography process, electron-beam writing, ion-beam writing, maskless photolithography, molecular imprint, and/or other suitable patterning processes. A post-exposure bake (PEB) may be performed to allow the exposed photoresist polymers to cleave.

Figure 4:
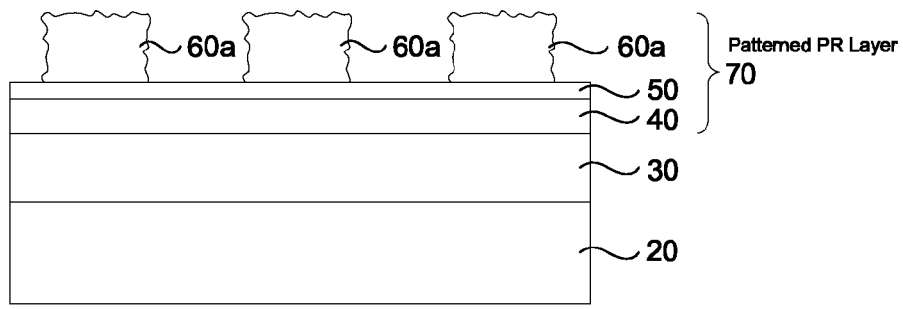

In FIG. 4, the exposed photoresist top layer 60 is developed after the exposure process. A developer is applied to the patterned resist to remove the soluble portions of the layer to form a patterned photoresist top layer 60a. The developer may include aqueous tetra-methyl ammonium hydroxide (TMAH) that is applied to the substrate 20. The patterned photoresist top layer 60a may be used as an etch mask to etch underlying layers. Due to the limits of the chemical properties of the photoresists, the wavelength or light sources, and/or resolution limits in optical systems, the patterned photoresist layer 60a, however may include line edge roughness. The line edge roughness is a result of the photoresist molecules that form in a random pattern and lack uniformity throughout the photoresist layer.

Figure 5:
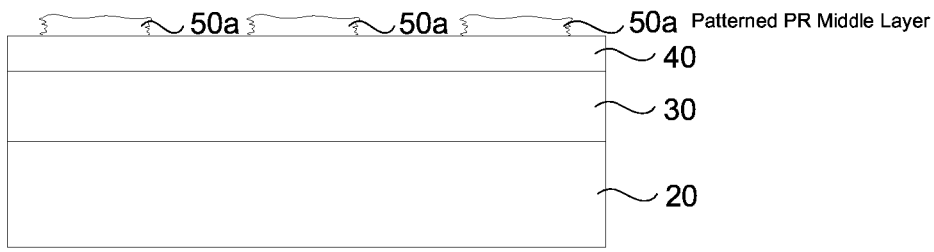
Figure 6:
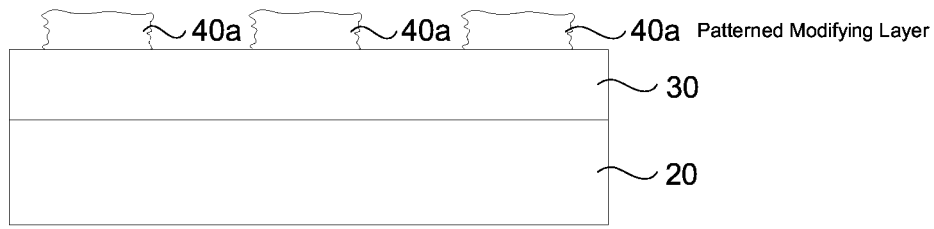

In one embodiment, using a suitable etching process, the patterned photoresist top layer 60a is then transferred to the underlying middle photoresist layer 50 to form patterned photoresist middle layer 50a, as shown in FIG. 5. The line edge roughness from the patterned photoresist top layer 60a may also be transferred to the patterned photoresist middle layer 50a. The patterned photoresist top layer 60a may be removed thereafter using a suitable process, such as wet stripping or plasma ashing. In an exemplary embodiment, using a suitable etching process, the patterned photoresist middle layer 50a is then used as an etching mask to etch underlying modifying layer 40 to form patterned modifying layer 40a, as shown in FIG. 6. The line edge roughness from the patterned photoresist middle layer 50a may also be transferred to the modifying layer 40a.

In the prior art lithography processes, a conventional photoresist polymer is used. When this polymer is formed on the substrate, the molecules form in a random pattern and lack uniformity throughout the layer. After the photoresist is exposed and developed, there is a large line edge roughness that exists as a result of the random pattern of the photoresist molecules. This large line edge roughness causes the developed image to blur and reduces the resolution of the lithography and the subsequent etching process. This prevents the formation of the fine pattern required for the continued development of 32 nm and smaller devices. A novel aspect of the present disclosure is performing a treatment on the patterned modifying layer 40a to smooth the surfaces of the patterned modifying layer 40a thereby decreasing the line edge roughness and/or line width roughness.

Figure 7:
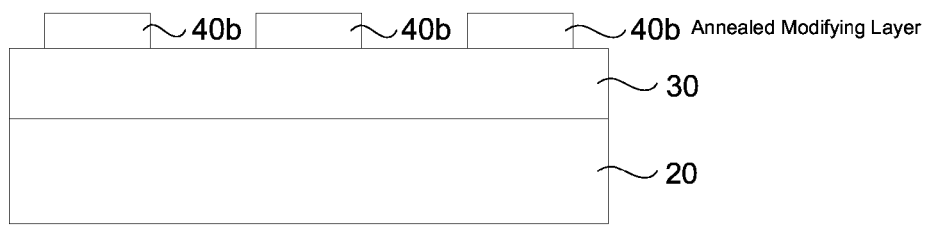

In FIG. 7, a curing treatment is performed on the patterned modifying layer 40a wherein the molecules of the modifying layer are reorganized and/or aligned to form modifying layer 40b having a pattern with reduced line edge roughness and/or line width roughness. In at least one embodiment, the treatment comprises exposing the patterned modifying layer 40a to an aligning light composed of ultraviolet radiation, wherein the ultraviolet radiation has a wavelength ranging from about 100 nm to about 400 nm The aligning light may be polarized, for example linearly, elliptically or, circularly. In another embodiment, the treatment comprises exposing the modifying layer 40a to an IR radiation. The modifying layer 40a may be cured to a temperature greater than a glass transition temperature ($T_g$) of the polymer material of the modifying layer 40a to reorganize the molecules in the polymer material. In some alternative embodiments, the treatment comprises heating the patterned modifying layer 40a on the substrate 20 to a glass transition temperature ($T_g$) higher than the modifying layer 40a to reorganize and align the molecules forming modifying layer 40a. In one embodiment, the substrate is heated to a temperature of from about 50 Celsius to about 500 Celsius for about 1 second to about 600 minutes.

The treatment purpose is to apply energy for molecular structure arrangement. The treatment alters the chemical bond, orientation, organization, and/or alignment of the molecules in the polymer of the modifying layer 40a. The benefit of this treatment is that the organized molecules in the modifying layer 40a reduce the line width roughness and/or line edge roughness during the subsequent photolithography process. This increases the resolution of the photolithography and allows for a finer pattern and a reduction in image blurring in the modifying layer or photoresist material layer during the subsequent etching process. The higher resolution of the photolithography allows for further miniaturization of microelectronic devices.

Figure 8:
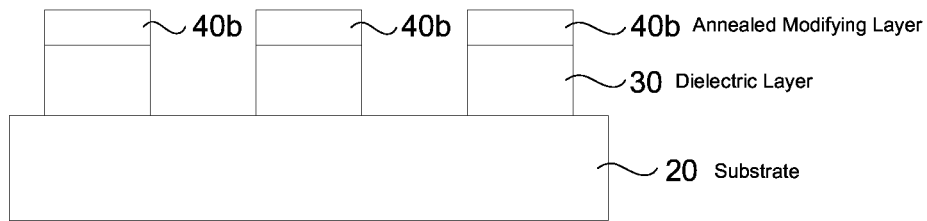

Using a suitable etching process, the patterned modifying layer 40b having reduced LER and/or LWR is then transferred to the underlying dielectric layer 30, as shown in FIG. 8.

In a method of forming a fine pattern, the sectional view of the semiconductor devices shown in FIGS. 2-8 are only for illustrative purpose and are not limiting. Further, although only a few exemplary embodiments of this invention have been described in detail above, those skilled in the art will readily appreciate that many modifications are possible in the exemplary embodiments without materially departing from the novel teachings and advantages of this disclosure. Also, further process steps in the fabrication of a semiconductor device are also contemplated.

Advantages of one or more embodiments of the present disclosure may include one or more of the following.

In one or more embodiments, with a reduction in the line edge roughness and/or line width roughness, the resolution of photolithography can be increased allowing for finer pattern and a reduction in image blurring during etching processes.

In one or more embodiments, the higher resolution of the photolithography allows for further miniaturization of microelectronic devices for the continued development of 32 nm and smaller devices.

The present disclosure has described various exemplary embodiments. According to one embodiment, a method of forming a fine pattern comprises depositing a modifying layer on a substrate. A photoresist layer is deposited on the modifying layer, the photoresist layer having a first pattern. The modifying layer is etched according to the first pattern of the photoresist layer. A treatment is performed to the etched modifying layer to form a second pattern, the second pattern having a smaller line width roughness (LWR) and/or line edge roughness (LER) than the first pattern. The second pattern is then etched into the substrate.

According to another embodiment, a method of forming a fine pattern, comprises providing a substrate having a dielectric layer. A combination modifying-photoresist layer is deposited on the dielectric layer. The combination modifying-photoresist layer is exposed to a first pattern. The combination modifying-photoresist layer is etched according to the first pattern. A treatment is performed on the etched combination modifying-photoresist layer to form a second pattern, the second pattern having a smaller line width roughness (LWR) and/or line edge roughness (LER) than the first pattern. The second pattern is etched into the dielectric layer.

According to yet another embodiment, a method of forming a fine pattern, includes providing a substrate having a dielectric layer. A polymer containing layer is deposited on the dielectric layer, the polymer containing layer having a predetermined glass transition temperature ($T_g$). A photoresist layer is deposited on the polymer containing layer, the photoresist layer having a first pattern. The polymer containing layer is etched according to the first pattern of the photoresist layer. The polymer containing layer is cured to a temperature higher than the predetermined glass transition temperature ($T_g$) to form a second pattern, the second pattern having a smaller line width roughness (LWR) and/or line edge roughness (LER) than the first pattern. The second pattern is etched into the dielectric layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of forming a fine pattern, comprising:
   depositing a modifying layer on a substrate;
   depositing a photoresist layer on the modifying layer, the photoresist layer having a first pattern;
   etching the modifying layer according to the first pattern of the photoresist layer;
   performing a treatment on the etched modifying layer to form a second pattern, the second pattern having at least one of a smaller line width roughness (LWR) and smaller line edge roughness (LER) than the first pattern; and
   etching the second pattern into the substrate.

2. The method of claim 1, wherein the modifying layer has a thickness in the range from about 1 nm to about 1000 nm.

3. The method of claim 1, wherein the modifying layer has a glass transition temperature ($T_g$) of less than about 200 Celsius and/or a surface tension of more than about 15 dynes/cm$^2$.

4. The method of claim 1, wherein the modifying layer comprises a polymer, homopolymer, or copolymer.

5. The method of claim 4, wherein the polymer is a material selected from the group consisting essentially of polycarbonate, polyethylene terephthalate, polysulfone, polyvinyl chloride, polyethylene, polypropylene, polyisobutylene, polystyrene, polytetraflourethylene, and combinations thereof.

6. The method of claim 1, wherein the treatment to the etched modifying layer comprises exposing the etched modifying layer to ultraviolet or IR radiation.

7. The method of claim 1, wherein the treatment to the etched modifying layer comprises exposing the etched modifying layer to heat.

8. The method of claim 4, wherein the treatment to the etched modifying layer alters at least one of the chemical bond, orientation, organization, and alignment of the molecules in the polymer.

9. A method of forming a fine pattern, comprising:
   providing a substrate having a layer thereon;
   depositing a combination modifying-photoresist layer on the layer, the combination modifying-photoresist layer having a top surface and a bottom surface, the bottom surface being in contact with the layer;
   exposing the combination modifying-photoresist layer to a first pattern;
   etching the combination modifying-photoresist layer according to the first pattern, the first pattern extending from the top surface to the bottom surface;
   performing a treatment on the etched combination modifying-photoresist layer to form a second pattern, the second pattern having at least one of a smaller line width roughness (LWR) and smaller line edge roughness (LER) than the first pattern; and
   etching the second pattern into the layer.

10. The method of claim 9, further comprising:
    developing the exposed combination modifying-photoresist layer according to the first pattern; and
    removing a photoresist layer of the combination modifying-photoresist layer.

11. The method of claim 9, wherein the combination modifying-photoresist layer has a thickness in the range from about 1 nm to about 1000 nm.

12. The method of claim 9, wherein a modifying layer of the combination modifying-photoresist layer has a glass transition temperature ($T_g$) of less than about 200 Celsius and/or a surface tension of more than about 15 dynes/cm$^2$.

13. The method of claim 12, wherein the modifying layer comprises a polymer, homopolymer, or copolymer.

14. The method of claim 13, wherein the polymer is a material comprising polycarbonate, polyethylene terephthalate, polysulfone, polyvinyl chloride, polyethylene, polypropylene, polyisobutylene, polystyrene, or polytetraflourethylene.

15. The method of claim 10, wherein the treatment to the modifying layer comprises exposing the modifying layer to at least one of ultraviolet and IR radiation.

16. The method of claim 10, wherein the treatment to the modifying layer comprises exposing the modifying layer to heat.

17. The method of claim 13, wherein the treatment to the modifying layer alters at least one of the chemical bond, orientation, organization, and alignment of the molecules in the polymer.

18. A method of forming a fine pattern, comprising:
    providing a substrate having a dielectric layer;
    depositing a polymer containing layer on the dielectric layer, the polymer containing layer having a predetermined glass transition temperature ($T_g$);
    depositing a photoresist layer on the polymer containing layer;
    patterning the photoresist layer with a first pattern;

etching the polymer containing layer according to the first pattern of the photoresist layer;

curing the polymer containing layer to a temperature higher than the predetermined glass transition temperature ($T_g$) to form a second pattern, the second pattern having at least one of a smaller line width roughness (LWR) and a smaller line edge roughness (LER) than the first pattern; and etching the second pattern into the dielectric layer.

19. The method of claim 18, wherein the polymer containing layer has a glass transition temperature ($T_g$) of less than about 200 Celsius and/or a surface tension of more than about 15 dynes/cm$^2$.

20. The method of claim 18, wherein the treatment to the step of curing the polymer containing layer alters at least one of the chemical bond, orientation, organization, and alignment of the molecules in the polymer.

* * * * *